United States Patent
Chu et al.

[11] Patent Number: 6,130,168
[45] Date of Patent: Oct. 10, 2000

[54] USING ONO AS HARD MASK TO REDUCE STI OXIDE LOSS ON LOW VOLTAGE DEVICE IN FLASH OR EPROM PROCESS

[75] Inventors: Wen-Ting Chu, Kaoshiung; Di-Son Kuo, Hsinchu; Chrong-Jung Lin, Hsin Tien; Hung-Der Su, Kao-Hsiung; Jong Chen, Taipei, all of Taiwan

[73] Assignee: Taiwan Semiconductor Manufacturing Company, Hsin-Chu, Taiwan

[21] Appl. No.: 09/349,844

[22] Filed: Jul. 8, 1999

[51] Int. Cl.$^7$ .................................. H01L 21/302
[52] U.S. Cl. ..................... 438/717; 438/734; 438/954
[58] Field of Search .................... 438/238, 733, 438/734, 723, 724, 717, 954

[56] References Cited

U.S. PATENT DOCUMENTS

| | | | |
|---|---|---|---|
| 5,440,158 | 8/1995 | Sung-Mu | 257/314 |
| 5,576,226 | 11/1996 | Hwang | 437/24 |
| 5,668,035 | 9/1997 | Fang et al. | 438/239 |
| 5,723,355 | 3/1998 | Chang et al. | 437/56 |
| 5,885,865 | 3/1999 | Liang et al. | 438/253 |
| 5,888,869 | 3/1999 | Cho et al. | 438/258 |
| 5,994,237 | 11/1999 | Becker et al. | 438/734 |
| 6,004,847 | 12/1999 | Clementi et al. | 438/258 |

*Primary Examiner*—Mary Wilczewski
*Assistant Examiner*—Calvin Lee
*Attorney, Agent, or Firm*—George O. Saile; Stephen B. Ackerman; Rosemary L.S. Pike

[57] ABSTRACT

A new method of forming differential gate oxide thicknesses for both high and low voltage transistors is described. A semiconductor substrate is provided wherein active areas of the substrate are isolated from other active areas by shallow trench isolation regions. A polysilicon layer is deposited overlying a tunneling oxide layer on the surface of the substrate. The polysilicon and tunneling oxide layers are removed except in the memory cell area. An ONO layer is deposited overlying the polysilicon layer in the memory cell area and on the surface of the substrate in the low voltage and high voltage areas. The ONO layer is removed in the high voltage area. The substrate is oxidized in the high voltage area to form a thick gate oxide layer. Thereafter, the ONO layer is removed in the low voltage area and the substrate is oxidized to form a thin gate oxide layer. A second polysilicon layer is deposited over the ONO layer in the memory area, over the thin gate oxide layer in the low voltage area, and over the thick gate oxide layer in the high voltage area. The second polysilicon layer, ONO layer and first polysilicon layer in the memory cell area are patterned to form a control gate overlying a floating gate separated by the ONO layer. The second polysilicon layer is patterned to form a low voltage transistor in the low voltage area and a high voltage transistor in the high voltage area.

20 Claims, 4 Drawing Sheets

USING ONO AS HARD MASK TO REDUCE STI OXIDE LOSS ON LOW VOLTAGE DEVICE IN FLASH OR EPROM PROCESS

BACKGROUND OF THE INVENTION (1) Field of the Invention

The invention relates to a method of fabricating both high and low voltage CMOS transistors in the fabrication of integrated circuits, and more particularly, to a method of fabricating both high and low voltage CMOS transistors while reducing shallow trench isolation (STI) oxide loss in the fabrication of integrated circuits.

(2) Description of the Prior Art

With the advent of large scale integration, many of the integrated circuits formed on a semiconductor substrate comprise several circuit functions on a single chip. For example, electrically programmable random access memory (EPROM) devices and FLASH EPROM devices include both memory devices and logic devices on a single chip. To optimize the devices and improve performance, it is desirable in the industry to provide logic devices having both thick and thin gate oxide layers thereunder. For example, typically a thin gate oxide is used in low voltage logic circuits to enhance device performance, while a thicker gate oxide is required for the high voltage transistors.

Typically, the tunnel oxide, floating gate, and ONO (oxide/nitride/oxide) layer are formed in the memory cell area first. Then, the thick gate oxide is grown. The thick gate oxide is removed in the low voltage area and a thin gate oxide is grown there. Unfortunately, removal of the thick gate oxide in the low voltage area will cause oxide loss from an underlying shallow trench isolation (STI) region, especially in the corner area. This will degrade electrical performance of the device. It is desired to find a way to form gate oxide layers of differing thicknesses without causing oxide loss in underlying STI regions.

U.S. Pat. No. 5,440,158 to Sung-Ma shows a method for forming a dual floating gate device. U.S. Pat. No. 5,723,355 to Chang et al teaches forming oxides having three different thicknesses. The method uses photoresist and etch back steps to form the three different thicknesses. U.S. Pat. No. 5,576,226 to Hwang teaches a method of forming oxide of two different thicknesses by implanting halogen ions into the portion of the substrate over which a thicker oxide layer is to be formed. U.S. Pat. No. 5,668,035 to Fang et al teaches growing a thick oxide overall, removing the thick oxide in an area, and then growing a thin oxide in that area.

SUMMARY OF THE INVENTION

A principal object of the present invention is to provide an effective and very manufacturable method of forming both high and low voltage device in the fabrication of an integrated circuit.

Another object of the present invention is to provide an effective and very manufacturable method of forming differential gate oxide thicknesses for both high and low voltage devices in the fabrication of an integrated circuit.

Another object of the present invention is to form differential gate oxide thicknesses for high and low voltage devices without causing oxide loss to underlying STI regions.

A further object of the invention is to form differential gate oxide thicknesses for both high and low voltage transistors in a FLASH or EPROM process without causing oxide loss to underlying STI regions.

A still further object is to form differential gate oxide thicknesses for both high and low voltage transistors in a FLASH or EPROM process without causing oxide loss to underlying STI regions by using ONO as a hard mask.

In accordance with the objects of this invention a new method of forming differential gate oxide thicknesses for both high and low voltage transistors is achieved. A semiconductor substrate is provided wherein active areas of the substrate are isolated from other active areas by shallow trench isolation regions and wherein there is at least one memory cell area, at least one low voltage area, and at least one high voltage area. A tunneling oxide layer is formed on the surface of the semiconductor substrate. A first polysilicon layer is deposited overlying the tunneling oxide layer. The first polysilicon layer and tunneling oxide layer are removed except in the memory cell area. An ONO layer is deposited overlying the first polysilicon layer in the memory cell area and on the surface of the semiconductor substrate in the low voltage and high voltage areas. The ONO layer is removed in the high voltage area. The semiconductor substrate is oxidized in the high voltage area to form a thick gate oxide layer wherein the ONO layer prevents oxidation in the low voltage area. Thereafter, the ONO layer is removed in the low voltage area to expose the semiconductor substrate. The exposed semiconductor substrate in the low voltage area is oxidized to form a thin gate oxide layer. A second polysilicon layer is deposited over the ONO layer in the memory area, over the thin gate oxide layer in the low voltage area, and over the thick gate oxide layer in the high voltage area. The second polysilicon layer, ONO layer and first polysilicon layer in the memory cell area are patterned to form a control gate overlying a floating gate separated by the ONO layer. The second polysilicon layer is patterned to form a low voltage transistor in the low voltage area and a high voltage transistor in the high voltage area.

BRIEF DESCRIPTION OF THE DRAWINGS

In the accompanying drawings forming a material part of this description, there is shown.

DESCRIPTION OF THE PREFERRED EMBODIMENTS

Figure 1:
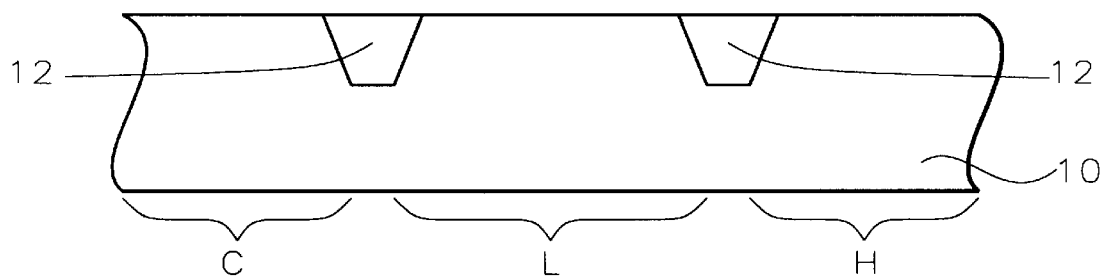
FIGS. 1 through 10 schematically illustrate in cross-sectional representation a preferred embodiment of the present invention.
Figure 2:
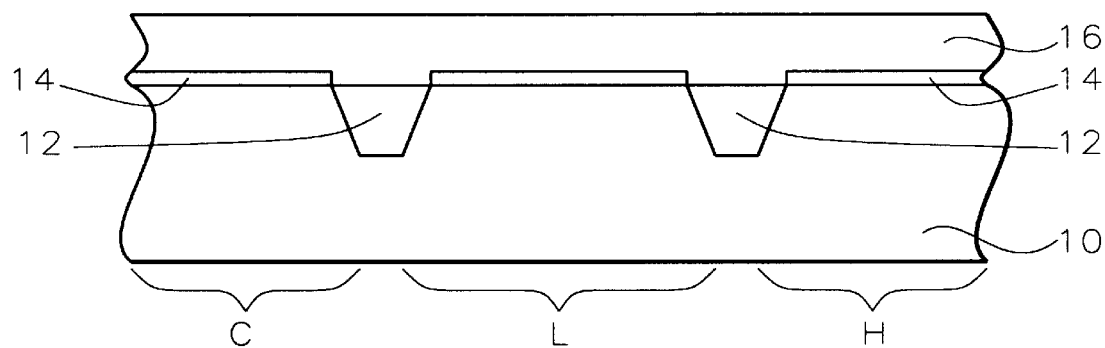

Referring now more particularly to FIG. 1, there is illustrated a portion of a partially completed integrated circuit. There is shown a semiconductor substrate 10, preferably composed of monocrystalline silicon. Shallow trenches are etched into the silicon substrate using conventional photolithography and etching techniques. The shallow trenches are filled with an oxide material according to one of the various methods used in the art. For example, the trenches may be filled with any suitable dielectric material, such as high density plasma chemically vapor deposited (HDPCVD) oxide 12 and planarized.

In the process of the invention, a memory device, such as a FLASH or EPROM device is to formed. High and low voltage logic devices are to be fabricated on the same semiconductor substrate as the memory cell devices. For illustration purposes, the memory cell area C is shown on the left side of the figures, separated by an STI region from a low voltage area L, shown in the center of the figures, which is in turn separated by another STI region from a high voltage area H, shown on the right side of the figure.

Figure 3:
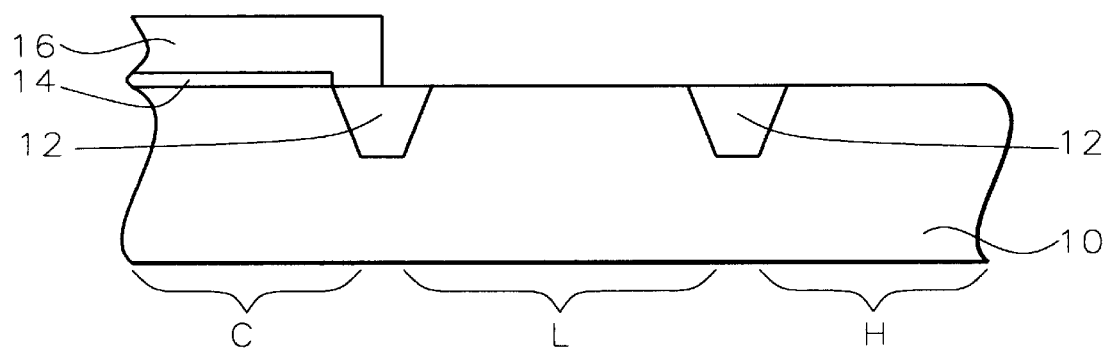

A tunneling oxide layer 14 is grown on the surface of the semiconductor substrate by thermal oxidation to a thickness of between about 70 and 100 Angstroms. A polysilicon layer 16 is deposited over the substrate to a thickness of between about 500 and 3000 Angstroms. The polysilicon layer and tunneling oxide layer are removed from all but the cell area C, using conventional lithographic and etching techniques. The resulting wafer is shown in FIG. 3.

Figure 4:
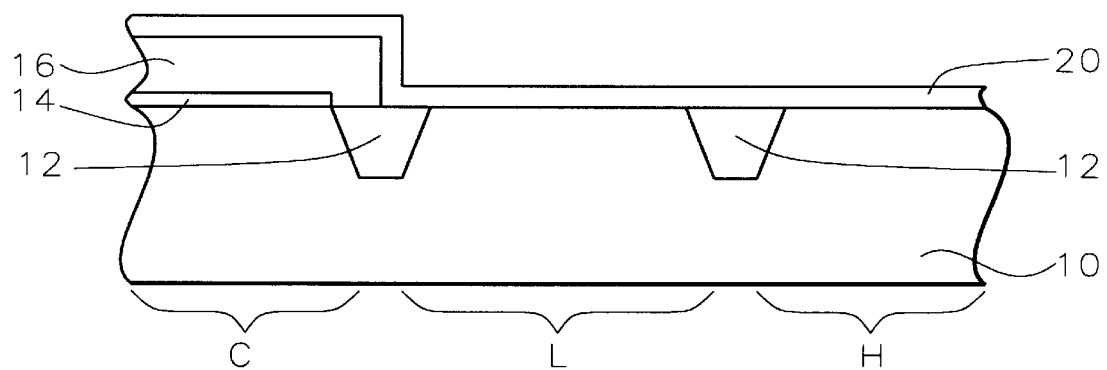

Referring now to FIG. 4, a layer of ONO 20 is deposited over the polysilicon line in the cell area and over the substrate. The ONO layer will serve as insulation between the polysilicon line 16 which will form the floating gate of the memory cell and an overlying polysilicon control gate. The ONO layer 20 comprises a first layer of silicon oxide having a thickness of between about 40 and 150 Angstroms, a second layer of silicon nitride having a thickness of between about 40 and 150 Angstroms, and a third layer of silicon oxide having a thickness of between about 40 and 150 Angstroms. Preferably, the first oxide layer will have a thickness of between about 30 and 50 Angstroms.

Figure 5:
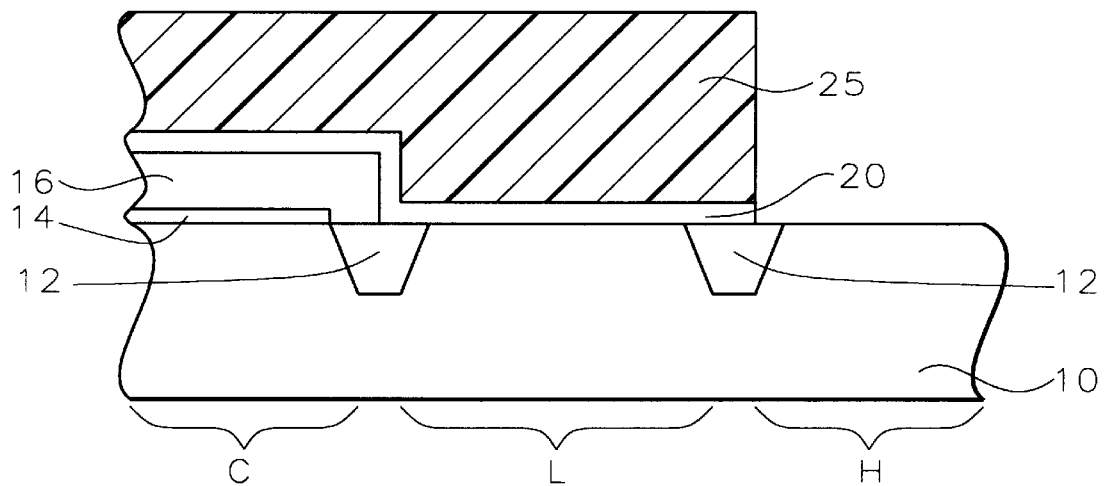
Figure 6:
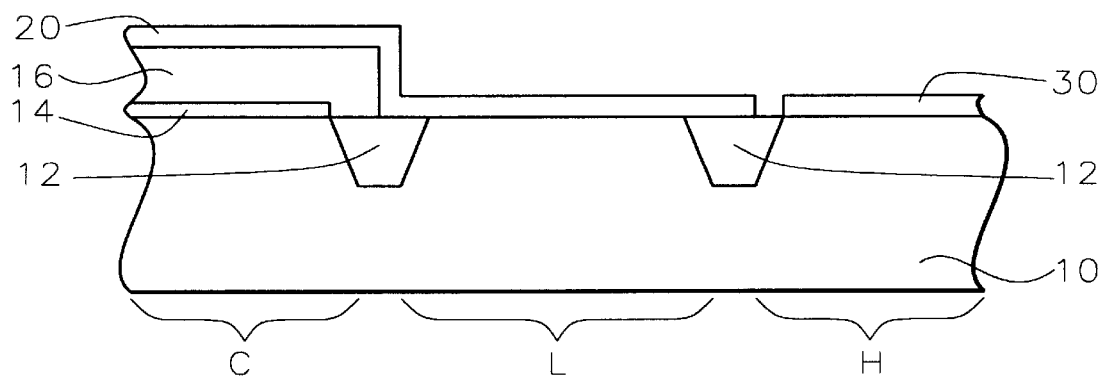

So far, the process of the invention has been conventional. Now, the key new steps of the invention will be described. Referring to FIG. 5, a layer of photoresist 25 is coated over the wafer and patterned to define the high voltage area H. The ONO layer in the high voltage area H is removed using a conventional dry etch. There will be some corner STI loss, but the high voltage device area is not so sensitive to this loss as is the low voltage device area. The photoresist mask 25 is removed and a thick gate oxide layer 30 is grown in the high voltage area H. The ONO layer in the low voltage area prevents oxidation there. The thick gate oxide layer 30 is grown to a thickness of between about 160 and 300 Angstroms, as shown in FIG. 6.

Figure 7:
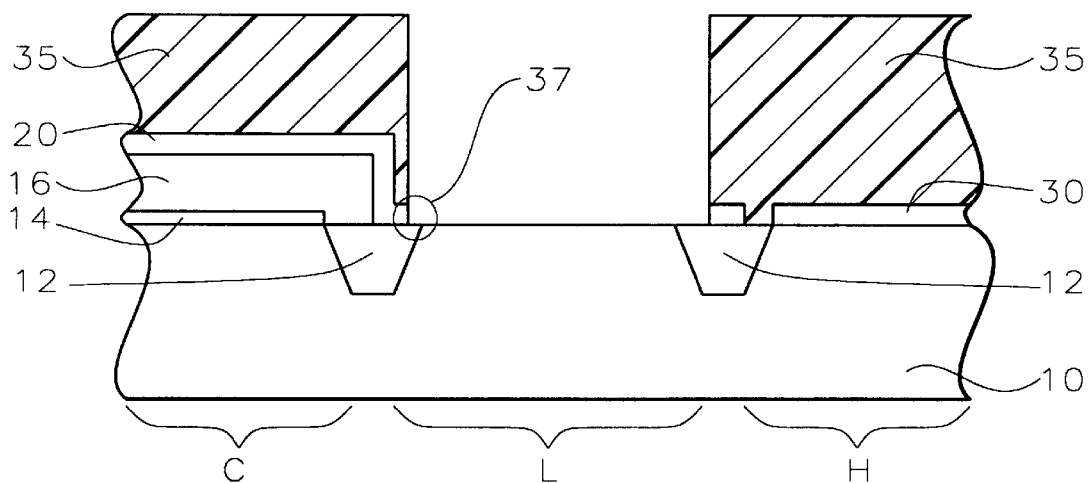

Now, a second photoresist mask 35 is formed over the substrate, this time exposing the low voltage area L. The ONO layer 20 in the low voltage area L is removed, as shown in FIG. 7. First, the top oxide layer is etched using a conventional dry etch. The silicon nitride layer is then removed by a dry etch with endpoint detection at the bottom oxide layer. The bottom oxide layer is then removed using a wet dip. Typically, in the prior art, the wet dip must remove an oxide layer having a thickness of at least 200 Angstroms. However, in the present invention, since ONO is used, the bottom oxide layer has a thickness of 40 to 150 Angstroms, and preferably 30 to 50 Angstroms. Because of this small thickness to be removed by the wet dip, the oxide loss at the corner region of the STI is much reduced. There is no significant loss of oxide at the corner 37 of the STI region.

Figure 8:
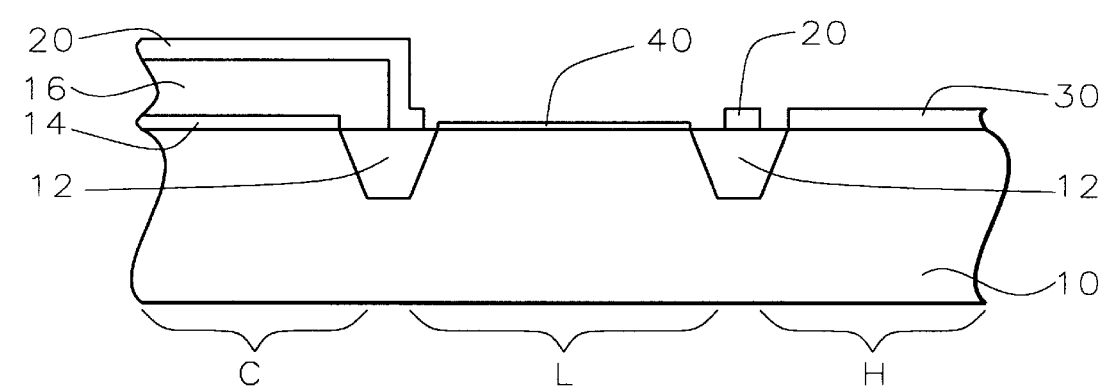

The photoresist mask 35 is removed and the low voltage area is subjected to oxidation. A thin gate oxide 40 is grown in the low voltage area to a thickness of between about 20 and 100 Angstroms, as shown in FIG. 8.

Figure 9:
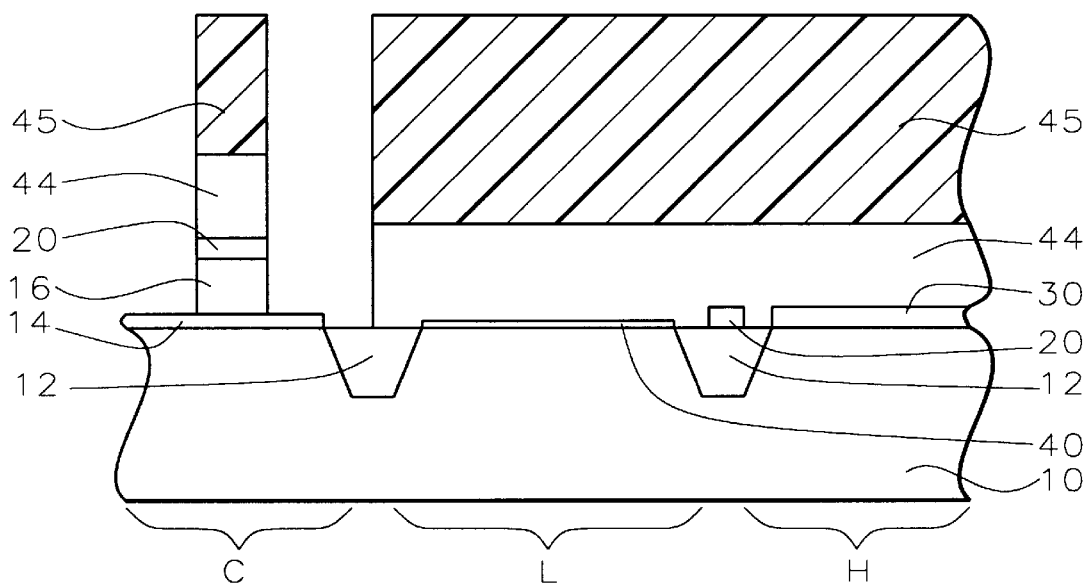

Processing now continues as is conventional in the art to form the memory devices and the high and low voltage devices on the same substrate. Referring now to FIG. 9, a second layer of polysilicon 44 is deposited over the substrate to a thickness of between about 500 and 3000 Angstroms.

The polysilicon layer 44 is etched away where it is not covered by the photomask 45 to form the floating gate 16 and the control gate 44 in the memory cell area C. The two gates are separated by the ONO insulating layer 20. The photomask 45 is removed.

Figure 10:
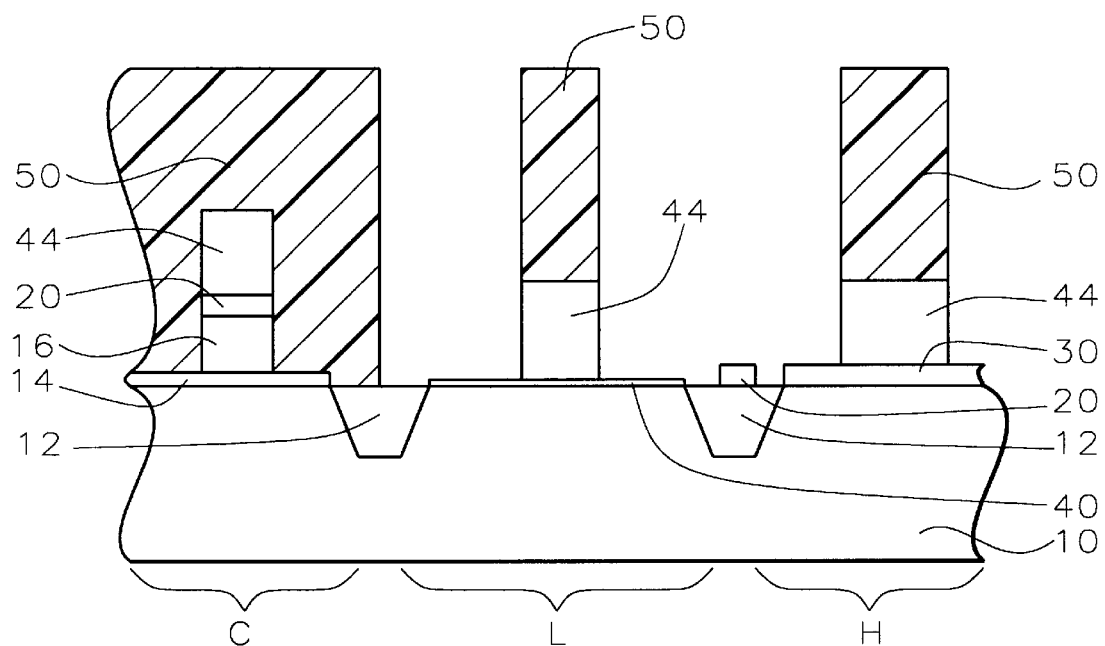

Now, referring to FIG. 10, the periphery transistors are formed in the low and high voltage areas, L and H, respectively. Photoresist mask 50 is formed over the substrate and protecting the memory cell area C. The polysilicon layer 44 is etched away where it is not covered by the mask 50.

Figure 11:
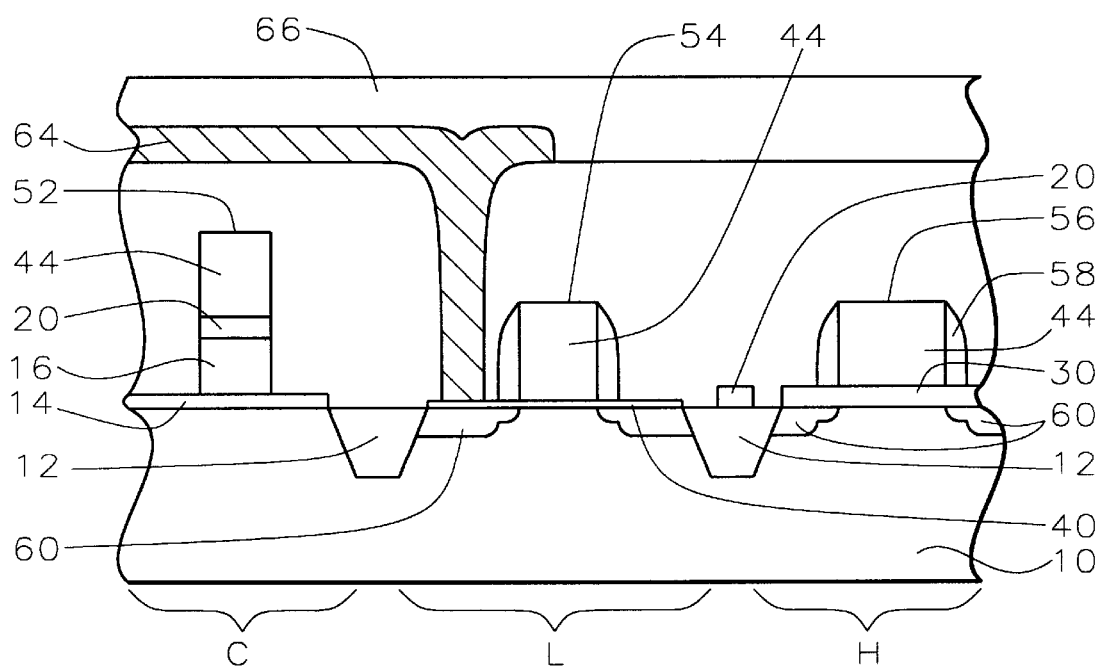
FIG. 11 schematically illustrates in cross-sectional representation a completed integrated circuit device fabricated according to the process of the present invention.

The photomask is removed. FIG. 11 illustrates the completed integrated circuit device, including the memory device 52 in the cell area C, low voltage transistor 54, and high voltage transistor 56. The device may be completed as is conventional in the art. For example, sidewalls 58 have been formed on the sidewalls of the transistors 54 and 56. Associated source and drain regions 60 have been formed within the semiconductor substrate. For example, an interconnection line is shown extending through the dielectric layer 62 to one of the source/drain regions 60. A passivation layer 66 completes the device.

The process of the present invention provides a very manufacturable way to provide gate oxide layers of differing thicknesses while maintaining the integrity of the underlying STI regions, especially in the low voltage regions. Specifically, oxide loss from the STI regions, especially in the corners, is reduced by the process of the invention. The ONO layer, used in the memory cell area for isolation between the floating and control gates, can be used as a hard mask to prevent oxidation in the low voltage area when the thick gate oxide is formed in the high voltage area. The ONO hard mask can be removed in the low voltage area without oxide loss to the underlying STI region because of the very thin first oxide layer to be removed by the wet etch. The thin gate oxide is then grown in the low voltage area.

While the invention has been particularly shown and described with reference to the preferred embodiments thereof, it will be understood by those skilled in the art that various changes in form and details may be made without departing from the spirit and scope of the invention.

What is claimed is:

1. The method of forming gate oxide layers having different thicknesses in the manufacture of an integrated circuit memory device comprising:

providing a semiconductor substrate wherein active areas of said substrate are isolated from other active areas by shallow trench isolation regions and wherein there is at least one memory cell area, at least one low voltage area and at least one high voltage area;

forming a tunneling oxide layer and a first polysilicon layer in said memory cell area;

depositing an ONO layer overlying said first polysilicon layer and on the surface of said semiconductor substrate in said low voltage and said high voltage areas wherein said ONO layer comprises a top oxide layer, a middle nitride layer, and a bottom oxide layer;

removing said ONO layer in said high voltage area;

thereafter oxidizing said semiconductor substrate in said high voltage area to form a thick gate oxide layer wherein said ONO layer prevents oxidation in said low voltage area;

thereafter removing said ONO layer in said low voltage area wherein said removing comprises:
dry etching away said top oxide layer;
thereafter dry etching away said middle nitride layer with an etch stop at said bottom oxide layer; and
thereafter wet etching away said bottom oxide layer wherein said wet etching does not etch into said shallow trench isolation regions;

thereafter oxidizing said semiconductor substrate in said low voltage area to form a thin gate oxide layer thinner than said thick gate oxide layer; and completing fabrication of said integrated circuit device having gate oxide layers having different thicknesses.

2. The method according to claim 1 further comprising:
depositing a second polysilicon layer over said ONO layer in said memory area, said thin gate oxide layer in said low voltage area, and said thick gate oxide layer in said high voltage area;
patterning said second polysilicon layer, said ONO layer and said first polysilicon layer in said memory cell area to form a control gate overlying a floating gate separated by said ONO layer; and
patterning said second polysilicon layer to form said low voltage transistor in said low voltage area and said high voltage transistor in said high voltage area.

3. The method according to claim 1 wherein said tunneling oxide layer has a thickness of between about 70 and 100 Angstroms.

4. The method according to claim 1 wherein said thick gate oxide layer has a thickness of between about 160 and 300 Angstroms.

5. The method according to claim 1 wherein said thin gate oxide layer has a thickness of between about 20 and 100 Angstroms.

6. The method according to claim 1 wherein said ONO layer comprises said bottom oxide layer of silicon oxide having a thickness of between about 40 and 150 Angstroms, said middle nitride layer of silicon nitride having a thickness of between about 40 and 150 Angstroms, and said top oxide layer of silicon oxide having a thickness of between about 40 and 150 Angstroms.

7. The method according to claim 6 wherein said first silicon oxide layer has a thickness of between about 30 and 50 Angstroms.

8. The method according to claim 1 wherein said bottom oxide layer has a thickness of between about 30 and 50 Angstroms.

9. The method of forming both a high voltage and a low voltage transistor in the manufacture of an integrated circuit memory device comprising:
providing a semiconductor substrate wherein active areas of said substrate are isolated from other active areas by shallow trench isolation regions and wherein there is at least one memory cell area, at least one low voltage area and at least one high voltage area;
forming a tunneling oxide layer and a first polysilicon layer in said memory cell area;
depositing an ONO layer overlying said first polysilicon layer and on the surface of said semiconductor substrate in said low voltage and said high voltage areas wherein said ONO layer comprises a top oxide layer, a middle nitride layer, and a bottom oxide layer;
removing said ONO layer in said high voltage area;
oxidizing said semiconductor substrate in said high voltage area to form a thick gate oxide layer wherein said ONO layer prevents oxidation in said low voltage area;
thereafter removing said ONO layer in said low voltage area to expose said semiconductor substrate wherein said removing comprises:
dry etching away said top oxide layer;
thereafter dry etching away said middle nitride layer with an etch stop at said bottom oxide layer; and
thereafter wet etching away said bottom oxide layer wherein said wet etching does not etch into said shallow trench isolation regions;
oxidizing said exposed semiconductor substrate in said low voltage area to form a thin gate oxide layer wherein said thin gate oxide layer is thinner than said thick gate oxide layer;
depositing a second polysilicon layer over said ONO layer in said memory area, said thin gate oxide layer in said low voltage area, and said thick gate oxide layer in said high voltage area;
patterning said second polysilicon layer, said ONO layer and said first polysilicon layer in said memory cell area to form a control gate overlying a floating gate separated by said ONO layer; and
patterning said second polysilicon layer to form said low voltage transistor in said low voltage area and said high voltage transistor in said high voltage area.

10. The method according to claim 9 wherein said tunneling oxide layer has a thickness of between about 70 and 100 Angstroms.

11. The method according to claim 9 wherein said thick gate oxide layer has a thickness of between about 160 and 300 Angstroms.

12. The method according to claim 9 wherein said thin gate oxide layer has a thickness of between about 20 and 100 Angstroms.

13. The method according to claim 9 wherein said ONO layer comprises said bottom oxide layer of silicon oxide having a thickness of between about 40 and 150 Angstroms, said middle nitride layer of silicon nitride having a thickness of 5 between about 40 and 150 Angstroms, and said top oxide layer of silicon oxide having a thickness of between about 40 and 150 Angstroms.

14. The method according to claim 13 wherein said first silicon oxide layer has a thickness of between about 30 and 50 Angstroms.

15. The method according to claim 9 wherein said bottom oxide layer has a thickness of between about 30 and 50 Angstroms.

16. The method of forming both a high voltage and a low voltage transistor in the manufacture of an integrated circuit memory device comprising:
providing a semiconductor substrate wherein active areas of said substrate are isolated from other active areas by shallow trench isolation regions and wherein there is at least one memory cell area, at least one low voltage area in which said low voltage transistor will be formed and at least one high voltage area in which said high voltage transistor will be formed wherein said high voltage transistor has a voltage higher than said low voltage transistor;
forming a tunneling oxide layer on the surface of said semiconductor substrate;
depositing a first polysilicon layer overlying said tunneling oxide layer;
removing said first polysilicon layer and said tunneling oxide layer except in said memory cell area;
depositing an ONO layer overlying said first polysilicon layer in said memory cell area and on the surface of said semiconductor substrate in said low voltage and said high voltage areas wherein said ONO layer comprises a first layer of silicon oxide having a thickness of between 40 and 150 Angstroms, a second layer of silicon nitride having a thickness of between 40 and 150 Angstroms, and a third layer of silicon oxide having a thickness of between 40 and 150 Angstroms;
removing said ONO layer in said high voltage area;
oxidizing said semiconductor substrate in said high voltage area to form a thick gate oxide layer;
thereafter removing said ONO layer in said low voltage area to expose said semiconductor substrate wherein said removing comprises:

dry etching away said top oxide layer;

thereafter dry etching away said middle nitride layer with an etch stop at said bottom oxide layer; and thereafter wet etching away said bottom oxide layer wherein said wet etching does not etch into said shallow trench isolation regions;

oxidizing said exposed semiconductor substrate in said low voltage area to form a thin gate oxide layer wherein said thin gate oxide layer is thinner than said thick gate oxide layer;

depositing a second polysilicon layer over said ONO layer in said memory area, said thin gate oxide layer in said low voltage area, and said thick gate oxide layer in said high voltage area;

patterning said second polysilicon layer, said ONO layer and said first polysilicon layer in said memory cell area to form a control gate overlying a floating gate separated by said ONO layer; and patterning said second polysilicon layer to form said low voltage transistor in said low voltage area and said high voltage transistor in said high voltage area.

17. The method according to claim 16 wherein said tunneling oxide layer has a thickness of between about 70 and 100 Angstroms.

18. The method according to claim 16 wherein said thick gate oxide layer has a thickness of between about 160 and 300 Angstroms.

19. The method according to claim 16 wherein said thin gate oxide layer has a thickness of between about 20 and 100 Angstroms.

20. The method according to claim 16 wherein said bottom oxide layer has a thickness of between about 30 and 50 Angstroms.

* * * * *